(12) United States Patent
Li et al.

(10) Patent No.: US 9,297,073 B2
(45) Date of Patent: Mar. 29, 2016

(54) ACCURATE FILM THICKNESS CONTROL IN GAP-FILL TECHNOLOGY

(71) Applicant: Applied Materials, Inc., Santa Clara, CA (US)

(72) Inventors: Ning Li, San Jose, CA (US); Wenbo Yan, Sunnyvale, CA (US); Victor Nguyen, Novato, CA (US); Cong Trinh, Santa Clara, CA (US); Mihaela Balseanu, Cupertino, CA (US); Li-Qun Xia, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/625,846

(22) Filed: Feb. 19, 2015

(65) Prior Publication Data

US 2015/0299856 A1   Oct. 22, 2015

Related U.S. Application Data

(60) Provisional application No. 61/981,022, filed on Apr. 17, 2014.

(51) Int. Cl.
*B44C 1/22* (2006.01)
*C23C 16/455* (2006.01)
*H01L 21/3065* (2006.01)

(52) U.S. Cl.
CPC ...... *C23C 16/45534* (2013.01); *H01L 21/3065* (2013.01)

(58) Field of Classification Search
CPC .................... B82Y 40/00; C23C 16/45534
USPC ............................................................ 216/37
See application file for complete search history.

(56) References Cited

U.S. PATENT DOCUMENTS

| | | | |
|---|---|---|---|
| 8,252,653 B2 | 8/2012 | Balseanu et al. | |
| 8,298,933 B2 * | 10/2012 | Shaviv et al. | 438/627 |
| 2012/0225191 A1 | 9/2012 | Yudovsky et al. | |
| 2012/0225203 A1 | 9/2012 | Yudovsky | |
| 2013/0217239 A1 | 8/2013 | Mallick et al. | |
| 2013/0217241 A1 | 8/2013 | Underwood et al. | |
| 2014/0023794 A1 | 1/2014 | Mahajani et al. | |
| 2014/0273524 A1 | 9/2014 | Nguyen et al. | |
| 2015/0255324 A1 | 9/2015 | Li et al. | |

FOREIGN PATENT DOCUMENTS

| | | |
|---|---|---|
| WO | 2014/130670 A1 | 8/2014 |
| WO | 2014/134476 A1 | 9/2014 |
| WO | 2014/144377 A1 | 9/2014 |

* cited by examiner

*Primary Examiner* — Roberts Culbert
(74) *Attorney, Agent, or Firm* — Patterson & Sheridan, LLP

(57) ABSTRACT

Embodiments disclosed herein generally relate to the processing of substrates, and more particularly, relate to methods for accurate control of film thickness using deposition-etch cycles. Particularly, embodiments of the present disclosure may be used in controlling film thickness during filling high aspect ratio features.

20 Claims, 7 Drawing Sheets

ACCURATE FILM THICKNESS CONTROL IN GAP-FILL TECHNOLOGY

CROSS-REFERENCE TO RELATED APPLICATIONS

This application claims priority to U.S. Provisional Patent Application Ser. No. 61/981,022, filed on Apr. 17, 2014, which herein is incorporated by reference.

BACKGROUND

1. Field

Embodiments disclosed herein generally relate to apparatus and methods for forming dielectric materials in high aspect ratio features. More particularly, embodiments of the present disclosure relate to controlling film thickness during spatial atomic layer deposition.

2. Description of the Related Art

As the device density on integrated circuits continues to increase, the size and distance between device structures continue to decrease. The decreased size results in increased high ratio of height to width in gaps in the structures and trenches between structures. To form integrated circuits, these high aspect ratio gaps and trenches are usually filled with dielectric materials like silicon nitride or silicon oxide to form electrical isolation. However, as aspect ratios of the gaps and trenches increase to 3:1 or above, it becomes difficult to fill the deep, narrow trenches without generating a blockage caused by a void or seam in the fill volume.

Cyclic deposition-etch, a process in which a substrate is alternatingly exposed to a deposition environment and an etching environment so that the substrate is processed by deposition-etch cycles, may be used to perform high aspect ratio gap fill. However, it is challenging to control film thickness for cyclic deposition-etch. Problems, for example, film thickness loss, i.e. the actual thickness of film is thinner than the target film thickness, may occur in deposition-etch cycles.

Therefore, there remains a need for methods to accurately control film thickness for high aspect ratio gap/trench fill.

SUMMARY

Embodiments disclosed herein generally relate to the processing of substrates, and more particularly, relate to methods for forming dielectric materials by spatial atomic layer deposition.

One embodiment of the present disclosure includes a method for filling high aspect ratio structure. The method includes exposing one or more substrates to one or more deposition precursors to form an initial conformal layer of a target film on a surface of the one or more substrates, exposing the one or more substrates to an etchant to non-conformally remove a portion of the target film from the one or more substrates, performing an adjustment to compensate incubation period, thickness loss, or both caused by the etchant, and exposing the one or more substrates to the one or more deposition precursors to form an additional conformal layer of the film on the one or more substrates.

One embodiment of the present disclosure provides a method for filling high aspect ratio structures. The method includes exposing one or more substrates to one or more deposition precursors to form an initial conformal layer of a target film on a surface of the one or more substrates, exposing the one or more substrates to an etchant to non-conformally remove a portion of the target film from the one or more substrates, performing a surface treatment to remove any remaining etchant from the one or more substrates, and exposing the one or more substrates to the one or more deposition precursors to form additional conformal layer of the film on the one or more substrates.

One embodiment of the present disclosure provides a method for filling high aspect ratio structures. The method includes exposing one or more substrates to one or more deposition precursors to form an initial conformal layer of a target film on a surface of the one or more substrates, exposing the one or more substrates to an etchant to non-conformally remove a portion of the target film from the one or more substrates, performing a thermal treatment to reduce deposition incubation period, and exposing the one or more substrates to the one or more deposition precursors to form additional conformal layer of the film on the one or more substrates.

One embodiment of the present disclosure provides a method for filling high aspect ratio structures. The method includes exposing one or more substrates to one or more deposition precursors to form an initial conformal layer of a target film on a surface of the one or more substrates, exposing the one or more substrates to an etchant to non-conformally remove a portion of the film from the one or more substrates, performing a chamber treatment to remove any etchant in a process chamber, and exposing the one or more substrates to the one or more deposition precursors according to the adjusted deposition parameter to form additional layer of the film on the one or more substrates.

One embodiment of the present disclosure provides a method for filling high aspect ratio trenches. The method includes positioning one or more substrates in a process chamber having a gas distribution assembly including one or more deposition gas distribution sections and one or more etch gas distribution sections, forming an initial conformal layer of a target film on surfaces of the one or more substrates by activating the one or more gas deposition distribution sections and inactivating the one or more etch gas distribution sections while moving the one or more substrate relative to the gas distribution assembly for a first number of rotations, removing a portion of the target film from the one or more substrates by activating the one or more etch gas distribution sections and inactivating the one or more deposition gas distribution sections while moving the one or more substrate relative to the gas distribution assembly for a second number of rotations, determining an adjustment to the first number of rotations to compensate thickness loss and/or reduce deposition incubation period, and forming an additional conformal layer of the target film on surfaces of the one or more substrates by activating the one or more gas deposition distribution sections and inactivating the one or more etch gas distribution sections while moving the one or more substrate relative to the gas distribution assembly for an adjusted number of rotations.

Another embodiment of the present disclosure provides a method for filling high aspect ratio structure. The method includes exposing one or more substrates to one or more deposition precursors to form an initial conformal layer of a target film on a surface of the one or more substrates, exposing the one or more substrates to an etchant to non-conformally remove a portion of the target film from the one or more substrates, wherein the etchant comprises an active element, and the one or more deposition precursors comprises the active element, and exposing the one or more substrates to the one or more deposition precursors to form additional conformal layer of the film on the one or more substrates.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of the scope of the invention, for the invention may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

Figure 1A:
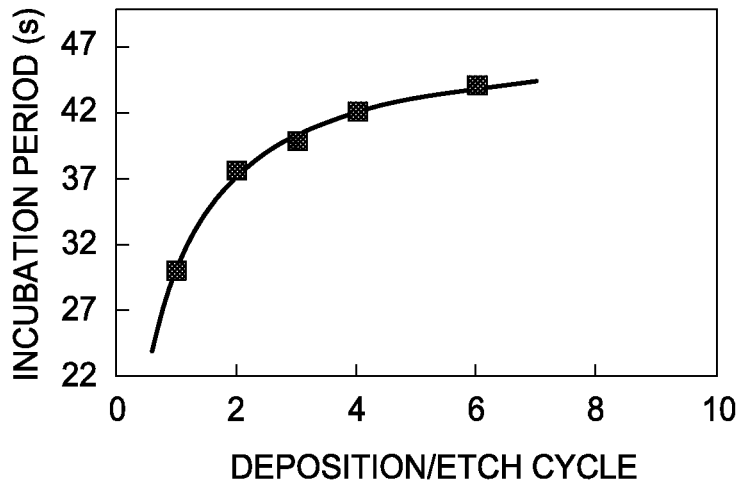
FIG. 1A is a graph illustrating lengths of incubation periods observed in deposition-etch cycles.

Embodiments disclosed herein generally relate to the processing of substrates, and more particularly, relate to methods for accurate control of film thickness using deposition-etch cycles. Particularly, embodiments of the present disclosure may be used in controlling film thickness during filling high aspect ratio features, such as trenches, gaps, and vias. Spatial atomic layer deposition, a process in which a substrate is alternatingly exposed to a deposition environment and an etching environment so that the substrate is processed by deposition-etch cycles, may be used to perform high aspect ratio fill. Embodiments of the present disclosure provide methods for accurate control of film thickness during spatial atomic layer deposition.

According to embodiments of the present disclosure, spatial atomic layer deposition may be performed in process chambers having multiple gas inlet channels spatially separated from one another. The multiple gas inlet channels may be used for introduction of different chemicals or plasma gases. The multiple gas inlet channels may be separated by a separator, such as a physical separator, an inert purging gas curtain, and/or vacuum pumping holes, to prevent mixing of gases from each of the multiple gas inlet channels. Substrates being processed may move relative to the multiple spatially separated gas inlet channels to sequentially have multiple surface exposures to different chemical or plasma environments. In one embodiment, the multiple gas inlet channels may provide two or more precursors according to an atomic layer deposition recipe to form a film layer by atomic layer deposition and an etchant to perform an etch process to etch a portion of the film layer formed by atomic layer deposition. The deposition and etch combination are repeatedly performed in multiple cycles until the high aspect ratio features are filled.

Deposition-etch cycles are beneficial to filling of high aspect ratio features. In each deposition-etch cycle, the deposition process deposits a conformal layer of film across the substrate, including upper openings, sidewalls and bottoms of the high aspect ratio feature. The etch process after the deposition may remove a portion of the deposited film in a non-conformal manner. Particularly, the film near the entrances and sidewalls is etched more than the film on the bottom because the etchant has readier access to the entrances and sidewalls than the bottoms. The non-conformal etch results in opening up the entrances of the high aspect ratio features thus enabling a bottom up filling of the high aspect ratio features.

To achieve accurate thickness control when performing deposition-etch cycles, such as spatial atomic layer deposition, systematic tests of deposition-etch cycles were performed. It has been observed that after an etch process is performed on the substrate, the deposition process in the next cycle experiences an incubation period during which film growth does not occur on the substrate even though deposition precursors are being supplied. It has also been observed that there is thickness loss in the deposition-etch cycles compared to the target film thickness.

FIG. 1A is a graph illustrating lengths of incubation periods observed in deposition-etch cycles. The lengths of incubation periods are observed when identical deposition-etch cycles were performed. Each deposition-etch cycle includes a deposition process of about 670 seconds and an etch process to etch back about 30% of the deposited film. The incubation period starts at about 30 seconds during the second cycle and saturates at about 45 seconds after the sixth cycle.

Not wish to be bound by theory, thickness loss in deposition-etch cycles may be contributed by incubation periods at the beginning of a deposition process after an etch treatment. Embodiments of the present disclosure relate to methods for accurate thickness control by compensating or reducing the incubation period. In one embodiment of the present disclosure, the incubation period may be reduced or eliminated by performing a surface treatment to the substrate after etching to remove any remaining etch agents. In another embodiment, the incubation period may be reduced or eliminated by selecting deposition precursors that are less sensitive to the etch chemistry used in the etch process. In another embodiment, the incubation period may be compensated by increasing the deposition time in the process recipe. In another embodiment, the incubation period may be compensated or eliminated by performing a thermal treatment after each etch step and before the next deposition step.

Figure 1B:
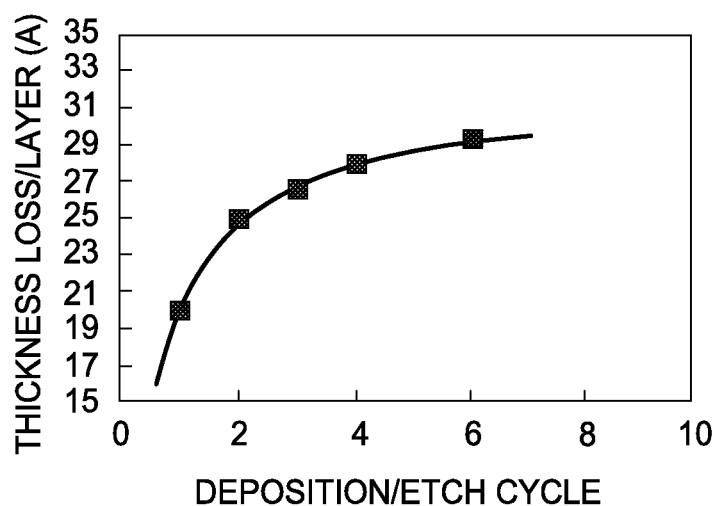
FIG. 1B is a graph illustrating thickness loss observed in deposition-etch cycles.

FIG. 1B is a graph illustrating thickness loss observed in deposition-etch cycles. FIG. 1B illustrates film thickness loss in each deposition-etch cycle when a plurality of identical deposition-etch cycles were performed. Each deposition-etch cycle includes a deposition process with a process baseline to deposit 80 angstrom film and an etch process to etch back about 30% of the deposited film. The thickness loss starts at about 20 angstroms and saturates at about 30 angstroms after the sixth cycle.

Embodiments of the present disclosure relate to methods for accurate thickness control by compensating or reducing the observed thickness loss. In one embodiment, the thickness loss may be reduced or eliminated by performing a surface treatment to the substrate after etching to remove any remaining etch agents. In another embodiment, the thickness loss may be reduced or eliminated by shortening the length of etch gas lines between a shut off valve and the process chamber. In another embodiment, the thickness loss may be reduced or eliminated by performing a chamber treatment after each etch process. For example a neutralization process by supplying a neutralizing agent to the process chamber may be performed to neutralize and remove etch agent. Alternatively, an extended chamber purge may be performed after etch process to neutralize the process chamber.

It should be noted that the incubation period and the thickness loss may be addressed alone or in combination to achieve desired accuracy in thickness control.

Figure 2A:
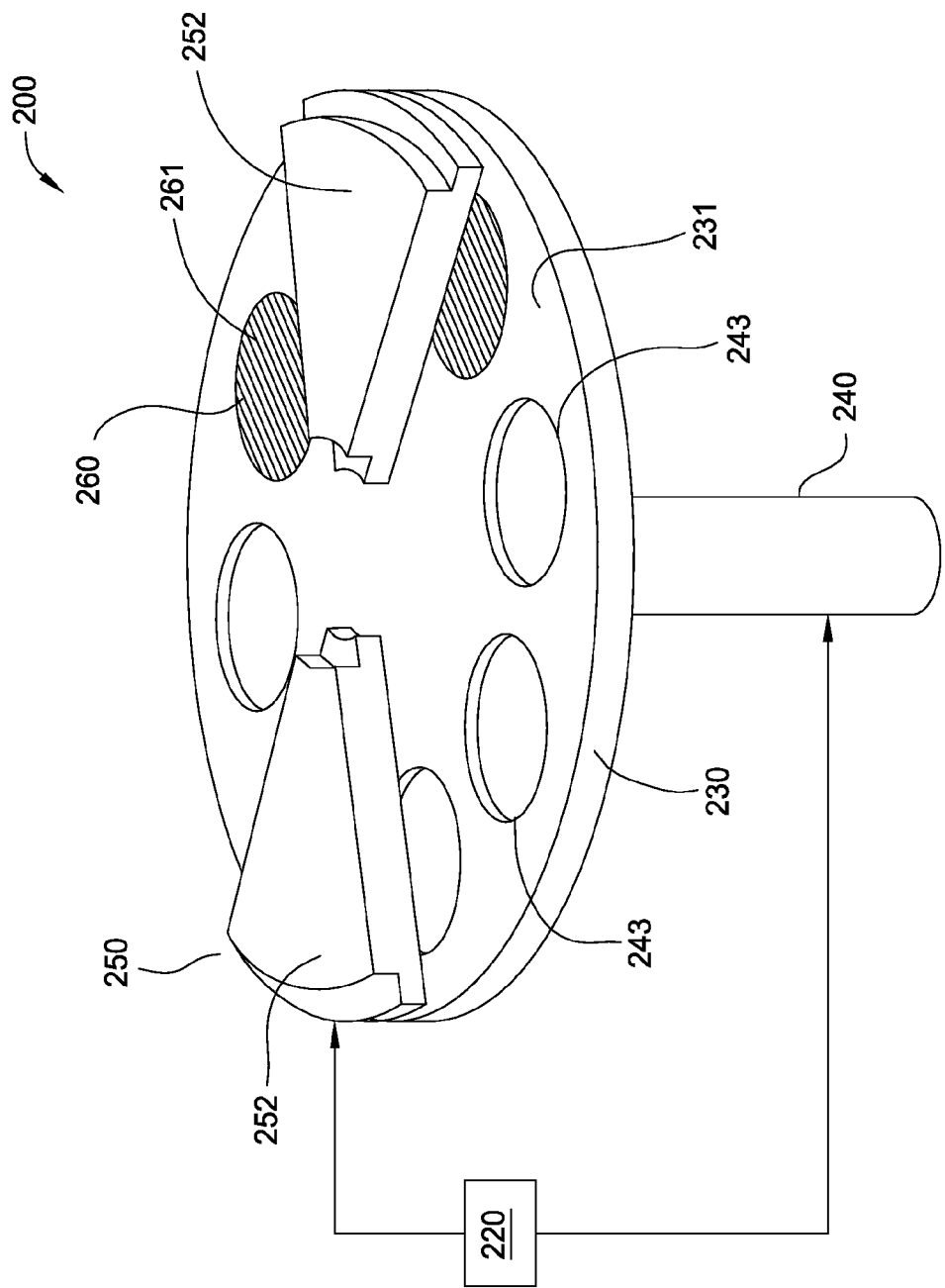
FIG. 2A is a perspective view of a carousel process chamber capable of performing spatial atomic layer deposition according to one embodiment of the present disclosure.

FIG. 2A is a perspective view of a carousel process chamber 200 capable of performing spatial atomic layer deposition according to one embodiment of the present disclosure. The process chamber 200 may include a susceptor assembly 230 and a gas/plasma distribution assembly 250. The susceptor assembly 230 has a top surface 231 and a plurality of recesses 243 formed in the top surface 231. Each recess 243 may be adapted to receive and support one substrate 260. In one embodiment, the susceptor assembly 230 has six recesses 243 for supporting six substrates 260. Each recess 243 is sized so that the substrate 260 supported in the recess 243 has the top surface 261 that is substantially coplanar with the top surface 231 of the susceptor assembly 230. The susceptor assembly 230 may be rotated by a support shaft 240 during and/or between deposition-etching processes.

The gas/plasma distribution assembly 250 includes a plurality of pie-shaped sections 252. Portions of the gas/plasma distribution assembly 250 are removed in FIG. 2A to illustrate the susceptor assembly 230 disposed below. Instead of formed by the plurality of sections 252, the gas/plasma distribution assembly 250 may be formed in one piece having the same shape as the susceptor assembly 230.

The process chamber 200 further includes a controller 220. In one embodiment, the controller 220 may be loaded with programs, when operated, capable of performing methods according to embodiments of the present disclosure.

Figure 2C:
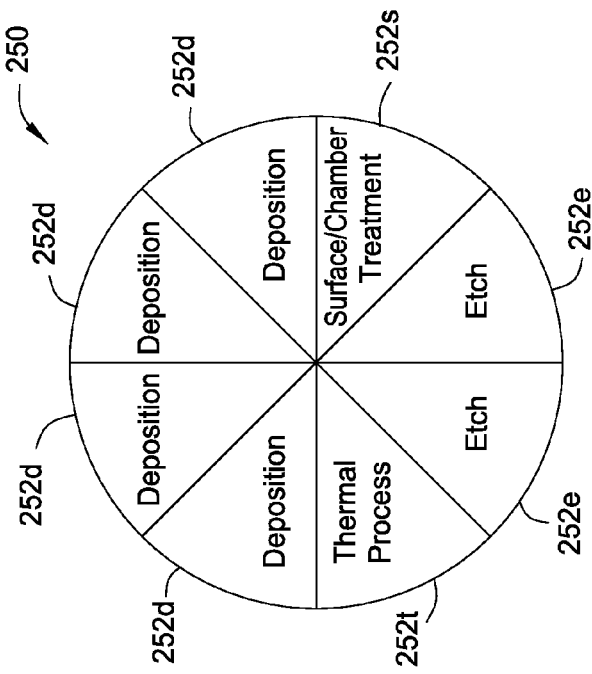
FIG. 2C is a schematic plan view of the gas/plasma distribution assembly of FIG. 2B arranged according to one embodiment of the present disclosure.
Figure 2B:
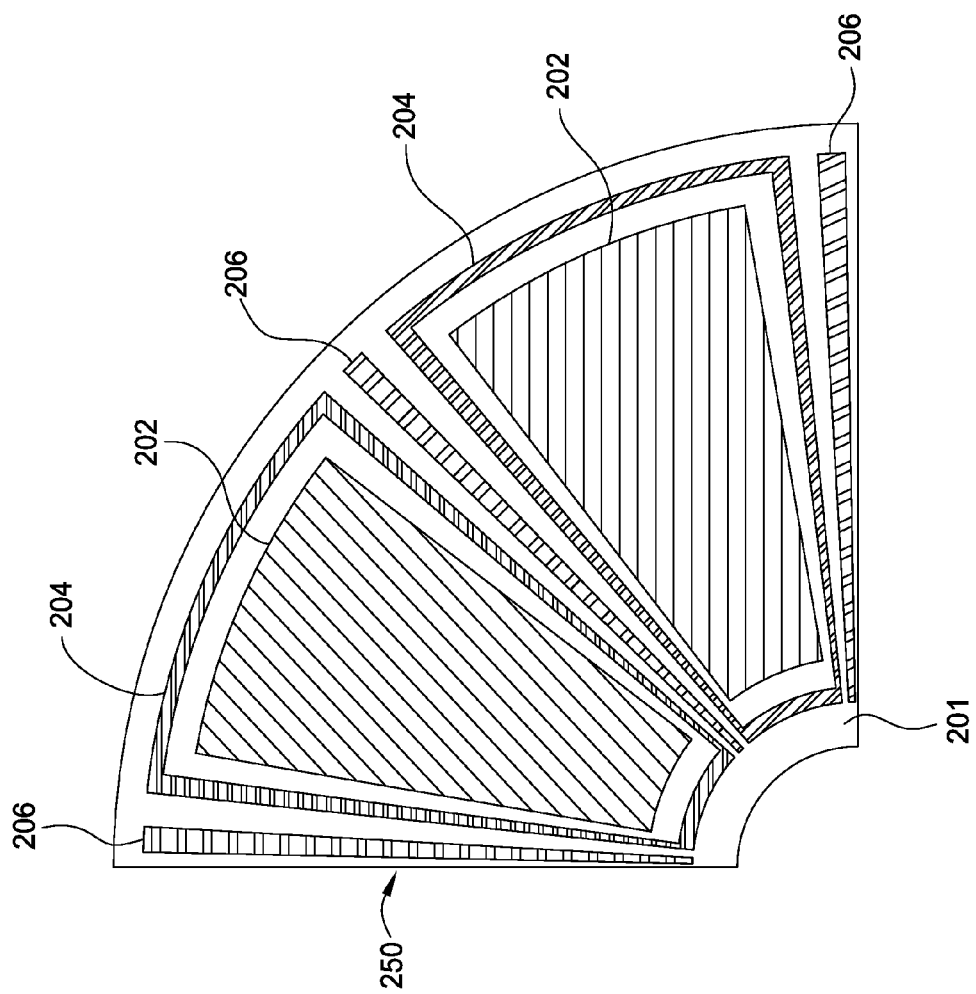
FIG. 2B is a schematic bottom view of a portion of a gas/plasma distribution assembly of the carousel process chamber of FIG. 2A according to one embodiment of the present disclosure.

FIG. 2B is a schematic bottom view of a portion of the gas/plasma distribution assembly 250. The gas/plasma distribution assembly 250 has a surface 201 facing the susceptor assembly 230. A plurality of gas/plasma ports 202 may be formed in the surface 201. Surrounding each gas/plasma port 202 is a purge gas port 204. A vacuum port 206 may be positioned between adjacent gas/plasma ports 202. Each gas/plasma port 202 may be configured to deliver one or more process gases to perform deposition, etch, thermal process, surface treatment, a chamber treatment, or any process dictated of the process recipe to be performed.

During operation, the substrates 260 rotate relative to the gas/plasma distribution assembly 250 so that each substrate 260 sequentially faces the plurality of sections 252 to be processed by the plurality of sections 252. In one embodiment, two or more sections 252 configured for two or more processes may be activated at the same time so that the two or more processes are performed to the substrates 260 during each rotation. In another embodiment, only sections 252 configured to perform the same process are activated at any given time so that only one process is performed in the process chamber 200 at any given time and length of each process is controlled by the number of rotations during the process.

The gas/plasma assembly 250 may include eight gas/plasma ports 202 disposed across the surface 201. The gas/plasma assembly 250 may include eight sections 252 each having one gas/plasma port 202. Each section 252 may be arranged to perform an individual process. FIG. 2C is a schematic plan view of the gas/plasma distribution assembly 250 of FIG. 2B arranged according to one embodiment of the present disclosure. In the configuration of FIG. 2C, the gas/plasma distribution assembly 250 includes four deposition sections 252d configured to deliver precursors for the deposition process. The gas/plasma distribution assembly 250 may further include two etch sections 252e configured to deliver etch agent or etch plasma for the etch process. The gas/plasma distribution assembly 250 may further include one thermal process section 252t to perform a thermal process. The gas/plasma distribution assembly 250 may further include one surface/chamber treatment section 252s to perform a surface treatment or a chamber treatment. In the configuration shown in FIG. 2C, the four deposition sections 252d are positioned immediately next to each other, the two etch sections 252e are positioned next to each other, and the thermal process section 252t and the surface/chamber treatment section 252s are positioned are part from each other and between the deposition sections 252d and etch sections 252e. It should be noted that other arrangement of the sections 252 may be arranged according to the process recipe.

Figure 3:
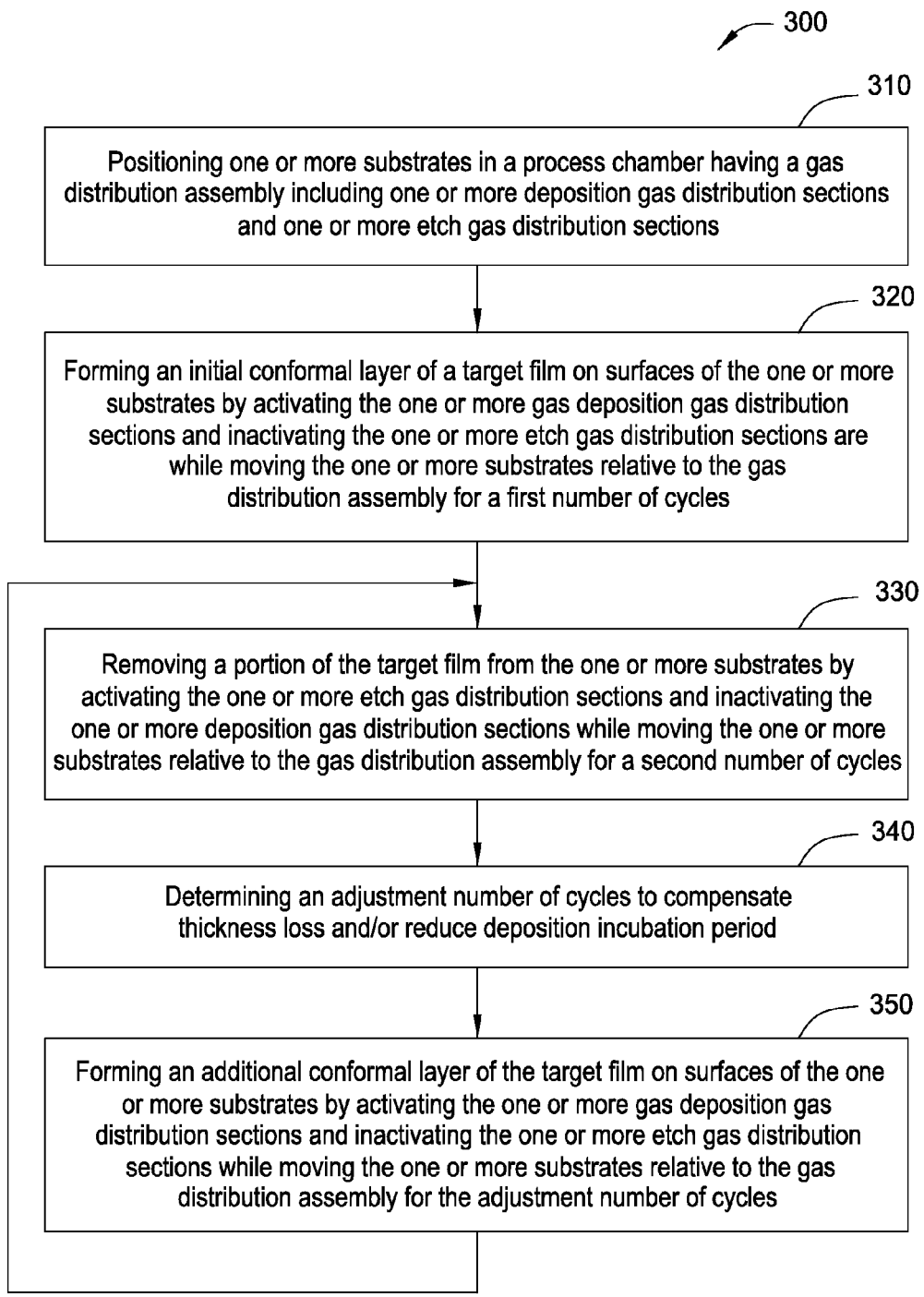
FIG. 3 is a flow chart of a method for control film thickness during spatial atomic layer deposition according to one embodiment of the present disclosure.

FIG. 3 is a flow chart showing a method 300 for control film thickness during spatial atomic layer deposition according one embodiment of the present disclosure. In one embodiment, the method 300 may be carried out using the process chamber 200 to fill high aspect ratio features with dielectric materials, such as silicon oxide or silicon nitride.

In box 310, one or more substrates may be positioned in a process chamber for processing. The process chamber, such as the process chamber 200, may have a gas distribution assembly including one or more deposition gas distribution sections and one or more etch gas distribution sections.

In box 320, an initial conformal layer of a target film may be formed on surfaces of the one or more substrates. The conformal layer may be formed by activating the one or more deposition gas distribution sections and inactivating the one or more etch gas distribution sections while moving the one or more substrates relative to the gas distribution assembly. The one or more substrates may rotate relative to the gas distribution assembly for a predetermined time to achieve desired thickness. In one embodiment, the predetermined time may be measured in the form of a predetermined number of rotations of the substrates relative to the gas distribution assembly. In one embodiment, the desired thickness may be between about 30 angstrom to about 70 angstrom for filling high aspect ratio features.

In one embodiment, the target film is silicon nitride. The deposition gas distribution sections are configured to deliver a silicon containing precursor and a nitrogen containing precursor. Suitable nitrogen containing precursors may include $N_2$, $NH_3$, or combinations thereof. In another embodiment, the target film is silicon oxide. The deposition gas distribution sections are configured to deliver a silicon containing precursor and an oxygen containing precursor. Suitable oxygen containing precursors may include $O_2$, $N_2O$, or combinations thereof.

Suitable silicon containing precursors may include, but not limited to, $SiH_4$, $Si_2H_6$, $Si(CH_3)_4$, $CH_3SiH_3$, $Si(C_2H_5)_4$, $SiCl_4$, $SiBr_4$, $((CH_3)_3CO)_3SiOH$, $(-HSiCH_3O-)_4$ (cyclic), $Si(OC_2H_5)_4$, $SiCl_2H_2$, and the combination thereof.

In one embodiment, the silicon containing precursor may contain an element selected for the etch process in box 330 so that the deposition process in the next cycle is less sensitive to any remaining etch agent, thus reducing both incubation period and thickness loss. The element may be a halogen element, such as fluorine and chlorine, or other active etching agent.

In box 330, a portion of the target film from the one or more substrates may be removed. The portion of the target film may be removed by activating the one or more etch gas distribution sections and inactivating the one or more deposition gas distribution sections while moving the one or more substrate relative to the gas distribution assembly. The one or more substrates may rotate relative to the gas distribution assembly for a predetermined number of rotations to remove desired amount of the target film. In one embodiment, between about 10 percent to about 30 percent in thickness of the target film formed during the previous deposition may be removed for filling high aspect ratio features. The etch process may be non-conformal when the one or more substrates include high aspect ratio features on the surfaces being processed.

The etch process may be performed by supplying a plasma of etchant from the etch sections of the gas distribution assembly. The plasma of etchant may include a halogen element as an active etching agent. The etchant may include fluorine or chlorine. Suitable etchant may include $NF_3$, $CHF_3$, $Cl_2$, $SiF_4$, $SiCl_4$, and combinations thereof. In one embodiment, the etchant comprises $NF_3$.

In box 340, an adjustment deposition time may be determined to compensate thickness loss and/or reduce deposition incubation period caused by the etch process of box 330. In one embodiment, the adjustment deposition time may be in the form of an adjustment number of rotations of the substrate relative to the gas distribution assembly when the deposition is performed by the process chamber 200. In one embodiment, the adjustment deposition time may be determined from empirical data. According to one embodiment, the adjustment deposition time may also be corrected according to the stage of the deposition-etch process. For example, at the early stage of deposition-etch cycle before incubation period and/or thickness loss reach the saturate level, a smaller adjustment may be applied compared with at later stage of deposition-etch cycle. The adjustment deposition time may be generally greater than the designed deposition time based on the deposition base line. The adjustment deposition time provides a compensation of incubation period after an etch process. The adjustment deposition time may also provide a compensation for film thickness loss.

In box 350, an additional conformal layer of the target film may be formed on surfaces of the one or more substrates. The additional conformal layer of the target film may be formed by activating the one or more deposition gas distribution sections and inactivating the one or more etch gas distribution sections while moving the one or more substrate relative to the gas distribution assembly for the adjustment deposition time. In one embodiment, the adjustment deposition time may be in the form of adjustment number of rotations when the deposition is performed by the process chamber 200. Box 350 is similar to box 320 except performed for a deposition time, for example, in the form of number of rotations, to eliminate or reduce thickness loss and/or incubation period.

Processes in box 330, box 340, and box 350 may be repeated to achieve desired film thickness. Even though not expressly discussed, a purge process is usually performed before changing process in the process chamber. For example, a purge process may be performed after each deposition process and each etch process. In one embodiment, a purge process may be performed at the end of box 320, box 330 and box 350.

Figure 4:
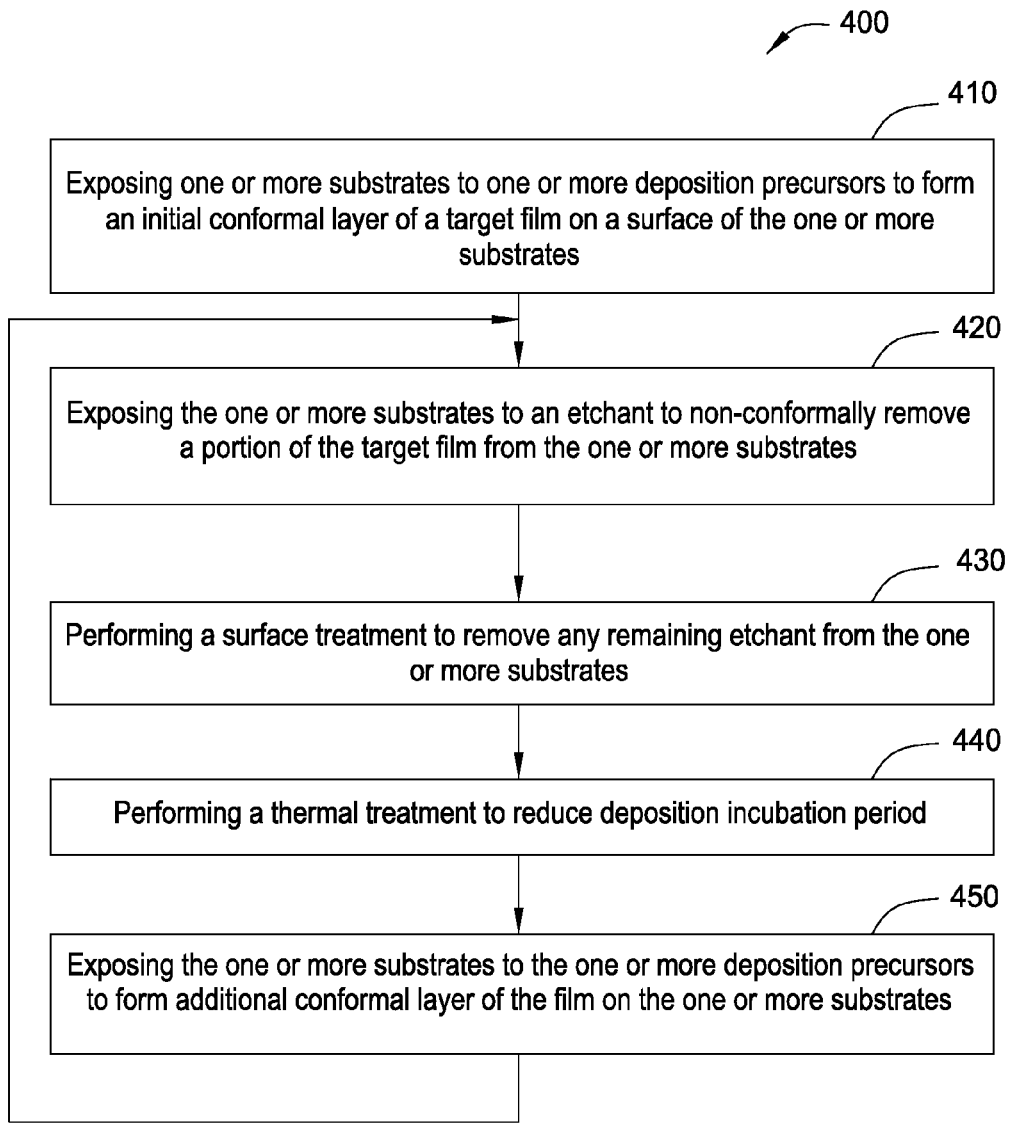
FIG. 4 is a flow chart of a method for control film thickness during spatial atomic layer deposition according to another embodiment of the present disclosure.

FIG. 4 is a flow chart showing a method 400 for control film thickness during spatial atomic layer deposition according another embodiment of the present disclosure. In one embodiment, the method 400 may be carried out using the process chamber 200 having the configuration shown in FIG. 2C to fill high aspect ratio features with dielectric materials, such as silicon oxide or silicon nitride.

In box 410, one or more substrates may be exposed to one or more deposition precursors to form an initial conformal layer of a target film on a surface of the one or more substrates. When filling high aspect ratio features, the target film may be silicon oxide or silicon nitride. The process of box 410 may be similar to the process of box 320.

In box 420, the one or more substrates may be exposed to an etchant to non-conformally remove a portion of the target film from the one or more substrates. The process of box 420 may be similar to the process of box 330.

In box 430, a surface treatment may be performed to remove any remaining etchant from the one or more substrates. By removing the remaining etchant, the surface treatment can reduce/eliminate both the incubation period and the thickness loss. When performed by a process chamber similar to the process chamber 200, the one or more substrates may be rotated relative to the gas distribution assembly with only the surface treatment section 252s being active.

The surface treatment may be performed by delivering a treatment gas toward the surfaces of the one or more substrates. When the etchant includes fluorine as active element, the treatment gas may be one of ammonia ($NH_3$), argon (Ar), nitrogen ($N_2$), hydrogen ($H_2$), helium (He), or a combination thereof.

In one embodiment, the surface treatment may be performed using a plasma of the treatment gas to physically sputter the surfaces of the one or more substrate. Alternatively, the surface treatment may be performed by chemical reactions between the treatment gas and the etchant to generate volatile molecules therefore removing the remaining etchant.

In box 440, a thermal treatment may be performed to reduce deposition incubation period. When the target film is silicon oxide or silicon nitride, the thermal treatment may be performed by heating the substrate temperature to between about 200° C. and about 600° C. When performed by a process chamber similar to the process chamber 200, the one or more substrates may be rotated relative to the gas distribution assembly with only the thermal process section 252t being active.

Even though FIG. 4 shows the method 400 performs processes in both box 440 and box 430, box 440 and box 430 may also be performed alternative to each other. That is only one process, process of box 440 or process of box 430, may be performed.

In box 450, the one or more substrates are exposed to the one or more deposition precursors to form additional conformal layer of the film on the one or more substrates. The process of box 450 is similar to the process of box 410.

Processes in box 420, box 430, box 440, and box 450 may be repeated to achieve desired film thickness.

Figure 5:
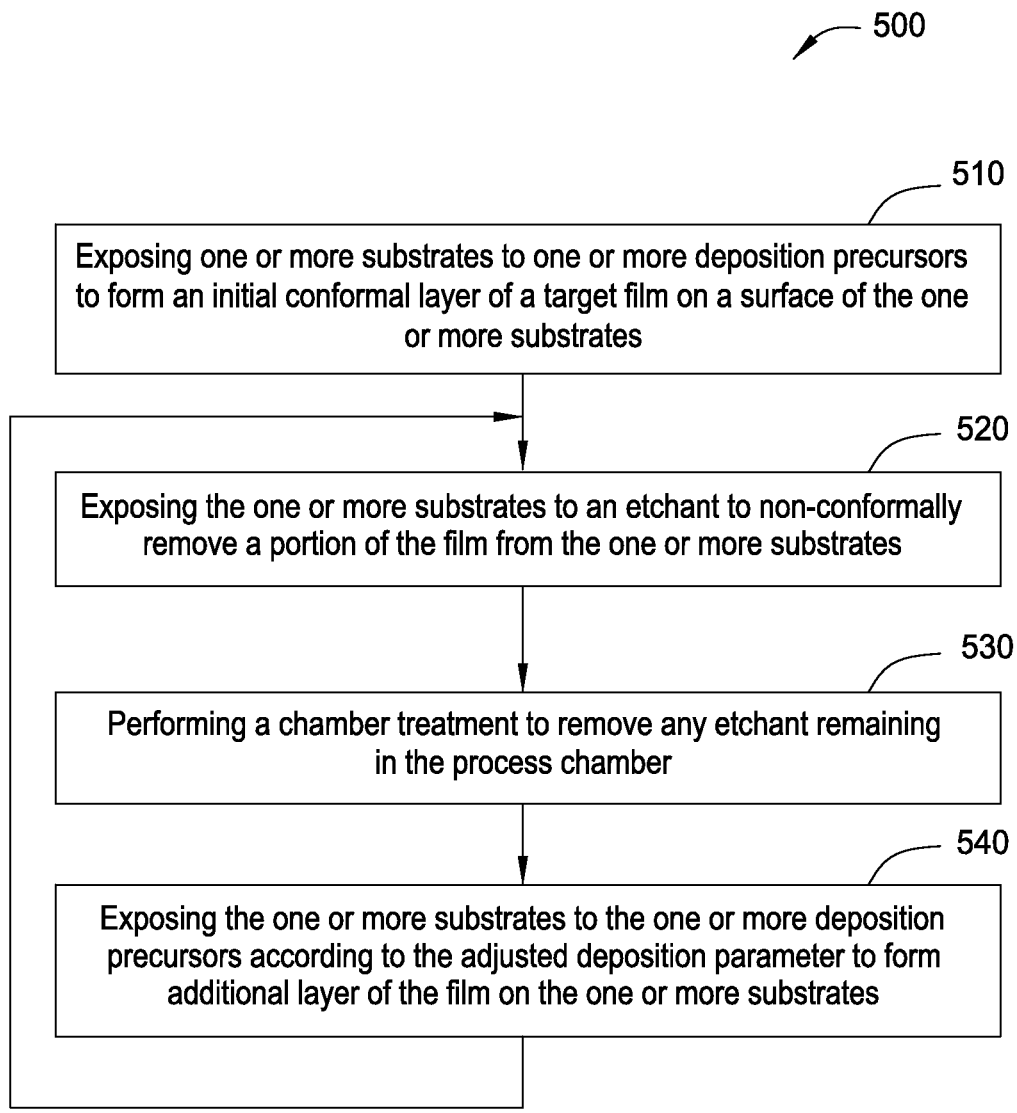
FIG. 5 is a flow chart of a method for controlling film thickness during deposition-etch cycles according to one embodiment of the present disclosure.

FIG. 5 is a flow chart showing a method 500 for controlling film thickness during deposition-etch cycles according one embodiment of the present disclosure. In one embodiment, the method 500 may be carried out using the process chamber 200 to fill high aspect ratio features with dielectric materials, such as silicon oxide or silicon nitride.

In box 510, one or more substrates may be exposed to one or more deposition precursors to form an initial conformal layer of a target film on a surface of the one or more substrates. When filling high aspect ratio features, the target film may be silicon oxide or silicon nitride. The process of box 510 may be similar to the process of box 320 and box 410.

In box 520, the one or more substrates may be exposed to an etchant to non-conformally remove a portion of the film from the one or more substrates. The process of box 520 may be similar to the process of box 330 and box 420.

In box 530, a chamber treatment may be performed to remove any etchant remaining in the process chamber. In one embodiment, the chamber treatment may remove remaining etchant from both the surfaces of the one or more substrates and inner surfaces of the process chamber.

In one embodiment, the chamber treatment may be a neutralization process that supplies a neutralizing agent to the process chamber to neutralize and remove etch agent. The neutralizing agent may be any suitable process gas that reacts with the etchant agent. For etchant including halogen elements, such as fluorine and chlorine, as active element, ammonia ($NH_3$) may be used as a neutralizing agent. When performed by a process chamber similar to the process chamber 200, the one or more substrates may be rotated relative to the gas distribution assembly with only the surface/chamber treatment section 252s being active to deliver the neutralizing agent to the process chamber.

In another embodiment, the chamber treatment may be an extended chamber purge after the etch process. Additionally, reducing the length of etchant supplying lines, particularly the length between the shut off valve of the etchant gas line and the inner volume of the process chamber, may also reduce the residual etchant.

In box 540, the one or more substrates are exposed to the one or more deposition precursors according to the adjusted deposition parameter to form an additional layer of the film on the one or more substrates. The process of box 540 is similar to the process of box 510.

Processes in box 520, box 530, and box 540 may be repeated to achieve desired film thickness.

Figure 6:
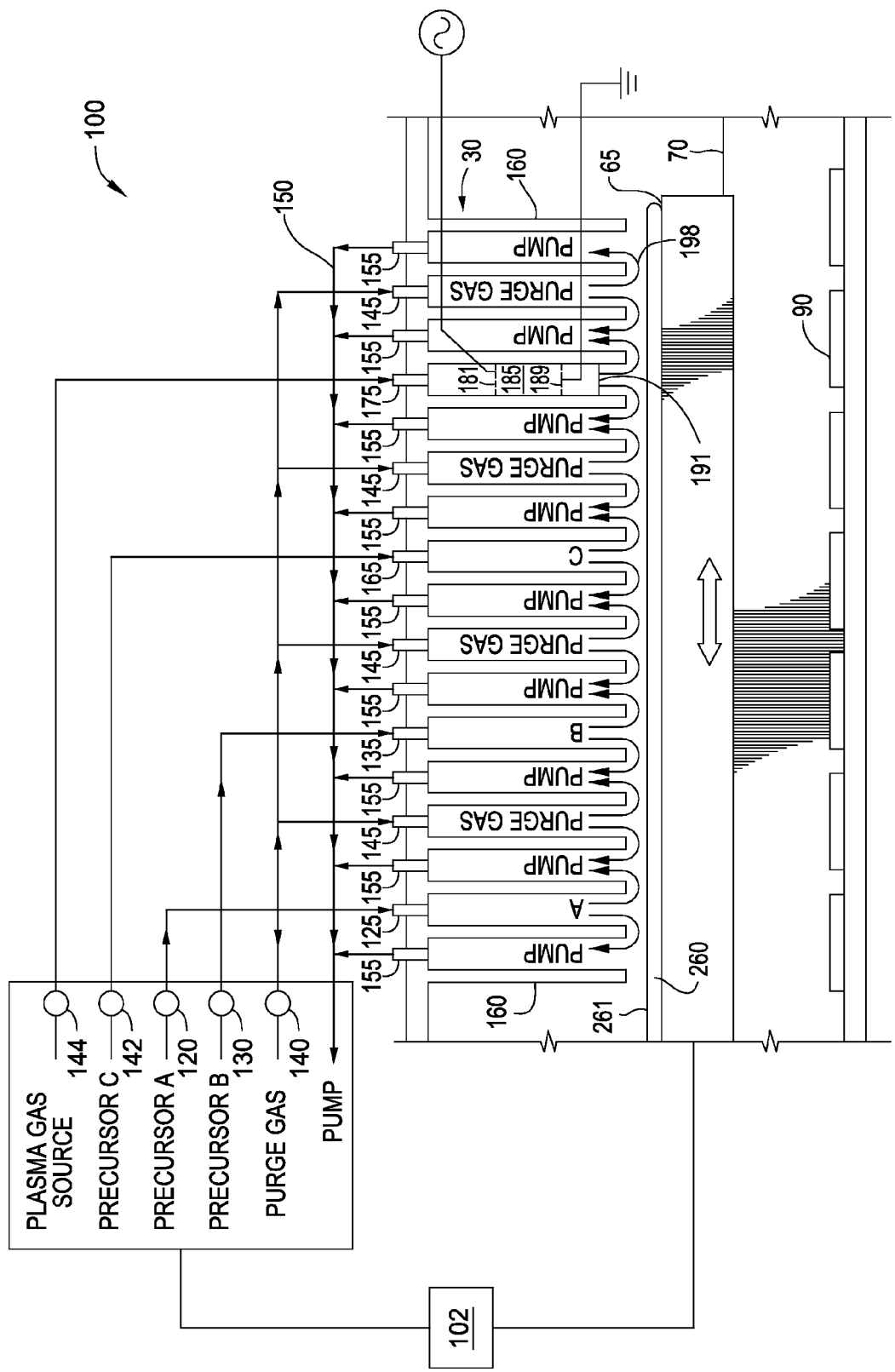
FIG. 6 is a schematic partial sectional side view of a linear process chamber according to one embodiment of the present disclosure.

FIG. 6 is a schematic partial sectional side view of a linear process chamber 100 according to one embodiment of the present disclosure. The process chamber 100 may be used to perform the methods according to embodiment of the present disclosure. The process chamber 100 includes a gas/plasma distribution assembly 30 capable of distributing one or more gases and/or a plasma across the top surface 261 of the substrate 260. The process chamber 100 may also include a shuttle 65 and a track 70 for transferring the substrate 260 back and forth in the process chamber 100 under the gas/plasma distribution assembly 30.

The substrate 260 may have a plurality of trenches to be filled with a dielectric material, such as silicon nitride or silicon oxide. The gas/plasma distribution assembly 30 includes a plurality of gas ports to transmit one or more gas streams and/or a plasma to the substrate 260 and a plurality of vacuum ports disposed between adjacent gas ports to transmit the gas streams out of the process chamber 100.

In one embodiment, the gas/plasma distribution assembly includes one or more of a first precursor injector 120, a second precursor injector 130, a third precursor injector 142, a plasma injector 144 and a purge gas injector 140. The injectors 120, 130, 140, 142, 144 may be controlled by a controller 102. The precursor injector 120 injects a continuous or pulse stream of a reactive precursor of compound A into the process chamber 100 through a gas port 125. The precursor injector 130 injects a continuous or pulse stream of a reactive precursor of compound B into the process chamber 100 through a gas port 135. The precursor injector 142 injects a continuous or pulse stream of a reactive precursor of compound C into the process chamber 100 through a gas port 165. The precursors A, B, C may be used to perform atomic layer deposition (ALD) of silicon nitride, silicon oxide, or other dielectric materials into the trenches formed on the substrate 260. The precursor A may contain silicon, precursor B may contain nitrogen and precursor C may contain oxygen. In one embodiment, there are only two precursors such as precursors A and B or precursors A and C.

In another aspect, a remote plasma source (not shown) may be connected to the precursor injector 120, precursor injector 130 and precursor injector 142 prior to injecting the precursors into the process chamber 100.

The plasma injector 144 may inject a plasma into the process chamber 100 through a plasma/gas port 175 to perform plasma etching on the substrate 60. The plasma injector 144 may inject an etchant gas, such as $NF_3$ into a plasma region 185 through the plasma/gas port 175. In one embodiment, the plasma injector 144 may inject a plasma generated from a remote plasma source. In one embodiment, electrodes 181, 189 may form an electrical field in a plasma region 185 and in turn create a plasma in the plasma region 185. Other types of plasma source may be used instead of electrodes 181, 189 to create a plasma in the plasma region 185. The remote plasma or the plasma formed in the plasma region 185 may go through a showerhead 191. The showerhead 191 may be configured to control the directionality of the etching process by letting more or less plasma onto the substrate 260.

The purge gas injector 140 injects a continuous or pulse stream of a non-reactive gas or purge gas into the process chamber 100 through a plurality of gas ports 145. The purge gas removes reactive material and reactive by-products from the process chamber 100. The purge gas is typically an inert gas, such as nitrogen, argon or helium. The plurality of gas ports 145 may be disposed between gas ports 125, 135, 165, 175 so as to separate the precursor compounds A, B, C and the plasma or etchant gas, thereby avoiding cross-contamination between the precursors and the plasma/etchant gas.

The process chamber 100 further includes a pumping system 150 connected to the process chamber 100. The pumping system 150 may be configured to evacuate the gas streams out of the process chamber 100 through one or more vacuum ports 155. The vacuum ports 155 may be disposed between gas ports 125, 135, 165, 175 so as to evacuate the gas streams out of the process chamber 100 after the gas streams react with the substrate surface 261 and to further limit cross-contamination between the precursors and the plasma/etchant gas.

The process chamber 100 includes a plurality of partitions 160 disposed between adjacent ports. A lower portion of each partition 160 extends close to the surface 261 of the substrate 260, for example, about 0.5 mm or greater from the surface 261. In this configuration, the lower portions of the partitions 160 are separated from the substrate surface 261 by a distance sufficient to allow the gas streams to flow around the lower portions toward the vacuum ports 155 after the gas streams react with the substrate surface 261. Arrows 198 indicate the direction of the gas streams. Since the partitions 160 operate as a physical barrier to the gas streams, the partitions 160 also limit cross-contamination between the precursors. A plurality of heaters 90 may be disposed below the substrate 260 to assist one or more processes performed in the process chamber 100.

In one embodiment, the controller 102 may be loaded with programs when operated to perform methods according to embodiments of the present disclosure, such as methods 300, 400, and 500. The controller may be a system computer, such as a mainframe, or a chamber-specific controller, such as a programmable logic controller.

Even though embodiments of the present disclosure are discussed in association with the process chambers 200 and 100, methods of the present disclosure may also be performed in one or more traditional process chambers.

Even though embodiments of the present disclosure are discussed in associations with high aspect ratio gap fill by spatial atomic layer deposition, embodiments of the present disclosure may be used in thickness control of forming any films or devices by deposition-etch cycles. For example, embodiments of the present disclosure may be used to perform accurate thickness control during blanket film depositions.

While the foregoing is directed to implementations of the present invention, other and further implementations of the invention may be devised without departing from the basic scope thereof, and the scope thereof is determined by the claims that follow.

The invention claimed is:

1. A method for filling high aspect ratio structure, comprising:
    exposing one or more substrates to one or more deposition precursors to form an initial conformal layer of a target film on a surface of the one or more substrates;
    exposing the one or more substrates to an etchant to non-conformally remove a portion of the target film from the one or more substrates;
    performing an adjustment to compensate incubation period, thickness loss, or both caused by the etchant; and
    exposing the one or more substrates to the one or more deposition precursors to form an additional conformal layer of the target film on the one or more substrates, wherein performing an adjustment comprises performing a surface treatment to the one or more substrates.

2. The method of claim 1, further comprising: repeating the remove a portion, the performing an adjustment, and the form an additional conformal layer.

3. The method of claim 1, wherein performing a surface treatment comprises delivering a treatment gas comprising one of ammonia, argon, nitrogen, hydrogen, helium, or combinations thereof.

4. The method of claim 1, wherein performing a surface treatment comprises delivering a plasma of a treatment gas to physically sputter the surface of the one or more substrates.

5. The method of claim 1, wherein performing a surface treatment comprises delivering a treatment gas to chemically react with the etchant to generate volatile molecules.

6. The method of claim 1, wherein performing a surface treatment comprises performing a thermal treatment.

7. The method of claim 1, wherein performing a surface treatment comprises:
    delivering a treatment gas towards the surface of the one or more substrates; and
    performing a thermal treatment.

8. A method for filling high aspect ratio structure, comprising:
    exposing one or more substrates to one or more deposition precursors to form an initial conformal layer of a target film on a surface of the one or more substrates;
    exposing the one or more substrates to an etchant to non-conformally remove a portion of the target film from the one or more substrates;
    performing an adjustment to compensate incubation period, thickness loss, or both caused by the etchant; and
    exposing the one or more substrates to the one or more deposition precursors to form an additional conformal layer of the target film on the one or more substrates, wherein performing an adjustment comprises performing a chamber treatment to remove any etchant remaining in the chamber.

9. The method of claim 8, wherein performing a chamber treatment comprises supplying a neutralizing agent to the chamber.

10. The method of claim 1, wherein the one or more deposition precursors include a silicon containing precursor and a nitrogen containing precursor.

11. The method of claim 8, wherein the one or more deposition precursors include a silicon containing precursor and a nitrogen containing precursor.

12. A method for filling high aspect ratio structure, comprising:
    exposing one or more substrates to one or more deposition precursors to form an initial conformal layer of a target film on a surface of the one or more substrates;
    exposing the one or more substrates to an etchant to non-conformally remove a portion of the target film from the one or more substrates;
    performing an adjustment to compensate incubation period, thickness loss, or both caused by the etchant; and
    exposing the one or more substrates to the one or more deposition precursors to form an additional conformal layer of the target film on the one or more substrates, wherein the one or more deposition precursors comprises an element that is an active element in the etchant.

13. The method of claim 10, wherein the element is a halogen element.

14. A method for filling high aspect ratio structure, comprising:
    positioning one or more substrates in a process chamber having a gas distribution assembly including one or more deposition gas distribution sections and one or more etch gas distribution sections;
    forming an initial conformal layer of a target film on a surface of the one or more substrates by activating the one or more deposition gas distribution sections and inactivating the one or more etch gas distribution sections while moving the one or more substrates relative to the gas distribution assembly for a first number of rotations;
    removing a portion of the target film from the one or more substrates by activating the one or more etch gas distribution sections and inactivating the one or more deposition gas distribution sections while moving the one or more substrates relative to the gas distribution assembly for a second number of rotations;
    determining an adjustment to the first number of rotations; and
    forming an additional conformal layer of the target film on the surface of the one or more substrates by activating the one or more deposition gas distribution sections and inactivating the one or more etch gas distribution sections while moving the one or more substrates relative to the gas distribution assembly for an adjusted number of rotations.

15. The method of claim 14, further comprising: repeating the removing a portion, determining an adjustment and forming an additional conformal layer.

16. The method of claim 15, wherein determining an adjustment to the first number of rotations comprises increasing deposition time to provide a compensation to a deposition incubation period caused by removing a portion of the target film.

17. The method of claim 14, further comprising performing a surface treatment to remove any remaining etchant from the one or more substrates.

18. The method of claim 14, further comprising performing a thermal treatment to reduce deposition incubation period.

19. The method of claim 14, further comprising performing a chamber treatment to remove any etchant in the process chamber.

20. A method for filling high aspect ratio structure, comprising:
- exposing one or more substrates to one or more deposition precursors to form an initial conformal layer of a target film on a surface of the one or more substrates;
- exposing the one or more substrates to an etchant to non-conformally remove a portion of the target film from the one or more substrates, wherein the etchant comprises an active element, and the one or more deposition precursors comprises the active element; and
- exposing the one or more substrates to the one or more deposition precursors to form an additional conformal layer of the target film on the one or more substrates.

* * * * *